(12) United States Patent
Fujita et al.

(10) Patent No.: US 8,518,631 B2
(45) Date of Patent: Aug. 27, 2013

(54) OPTICAL RECORDING MATERIAL, OPTICAL RECORDING METHOD, PHOTOSENSITIVE MATERIAL AND METHOD

(75) Inventors: Katsumasa Fujita, Osaka (JP); Minoru Kobayashi, Osaka (JP); Kazuya Kikuchi, Osaka (JP); Shin Mizukami, Osaka (JP); Satoshi Kawata, Osaka (JP); Shogo Kawano, Osaka (JP)

(73) Assignees: Osaka University, Suita-shi, Osaka (JP); Nanophoton Corporation, Osaka-shi, Osaka (JP)

( * ) Notice: Subject to any disclaimer, the term of this patent is extended or adjusted under 35 U.S.C. 154(b) by 349 days.

(21) Appl. No.: 12/735,579

(22) PCT Filed: Jan. 28, 2009

(86) PCT No.: PCT/JP2009/051373
§ 371 (c)(1),
(2), (4) Date: Jul. 29, 2010

(87) PCT Pub. No.: WO2009/096432
PCT Pub. Date: Aug. 6, 2009

(65) Prior Publication Data
US 2010/0323293 A1    Dec. 23, 2010

(30) Foreign Application Priority Data

Jan. 30, 2008 (JP) ................................. 2008-018665

(51) Int. Cl.
*G03F 7/004* (2006.01)
*G11B 7/24* (2013.01)
*G03C 1/73* (2006.01)

(52) U.S. Cl.
USPC .............. 430/270.15; 430/270.12; 430/281.1

(58) Field of Classification Search
None
See application file for complete search history.

(56) References Cited

U.S. PATENT DOCUMENTS 4,466,080 A * 8/1984 Swainson et al. ............. 365/106
7,459,263 B2 * 12/2008 Farid et al. ................ 430/270.11
7,964,333 B1 * 6/2011 Belfield .................... 430/270.13
(Continued)

FOREIGN PATENT DOCUMENTS

DE    3431440    * 4/1985
JP    03-284743  * 12/1991
(Continued)

OTHER PUBLICATIONS

Cerredor et al., "Two-photon 3D optical data storage via fluorecence modulation of an efficienct fluorene dye by photochromic diarylethene", Adv. Mater., vol. 18 pp. 2910-2914 (2006).*

(Continued)

*Primary Examiner* — Martin Angebranndt
(74) *Attorney, Agent, or Firm* — McGinn IP Law Group, PLLC

(57) ABSTRACT

Provided is a nonlinear optical material, an optical recording material, an optical recording method, a photosensitive material, a photopolymerization initiator, and a photosensitizer. One exemplary aspect of the present invention is a photosensitive material used for photolithography for forming a pattern by irradiating a photoresist with excitation light which includes a donor molecule 11 that is excited by the excitation light, and an acceptor molecule 12 that is excited by energy transfer or charge transfer from the excited donor 11.

17 Claims, 12 Drawing Sheets

(56) References Cited

U.S. PATENT DOCUMENTS

| | | | |
|---|---|---|---|
| 2003/0139484 A1* | 7/2003 | Bentsen et al. | 522/2 |
| 2004/0067451 A1* | 4/2004 | DeVoe et al. | 430/322 |
| 2004/0110984 A1* | 6/2004 | Cumpston et al. | 564/308 |
| 2004/0204513 A1* | 10/2004 | Takizawa et al. | 522/2 |
| 2005/0173683 A1* | 8/2005 | Marder et al. | 252/600 |
| 2006/0028634 A1* | 2/2006 | Tuberfield et al. | 355/77 |
| 2006/0194122 A1* | 8/2006 | Takizawa | 430/1 |
| 2006/0246375 A1* | 11/2006 | Shiono et al. | 430/270.11 |
| 2007/0147214 A1* | 6/2007 | Erben et al. | 369/103 |
| 2008/0215272 A1 | 9/2008 | Fujita et al. | |

FOREIGN PATENT DOCUMENTS

| | | | |
|---|---|---|---|
| JP | 05-241268 | * | 9/1993 |
| JP | 6-337496 | | 12/1994 |
| JP | 11-149663 | * | 6/1999 |
| JP | 2005-141128 | | 6/2005 |
| JP | 2005-285162 | | 10/2005 |
| JP | 2007-078889 | * | 3/2007 |
| JP | 2007-246723 | | 9/2007 |
| WO | 00/05624 | * | 2/2000 |
| WO | WO 2006/061947 A1 | | 6/2006 |
| WO | WO 2006/098296 A1 | | 9/2006 |

OTHER PUBLICATIONS

Giodano et al., diheteroarylethene as thermally stable photoswitchable acceptors for photochormic fluorescence resonance energy transfer (pcFRET), JACS, vol. 124(25) pp. 7481-7489 (2002).*

Murase et al., "Photochemicallyu induced fluorescence control with intermolecuylar energy transfer froma fluorescent dye to a photochromic diarylethene in a polymer flm." Macromol. vol. 36(4) pp. 964-966 (2003).*

Irie et al., "The effect of qadditives on the radiation-induced coloration of photochromic dithienylethene derivatives", Bull. Chem. Soc. Jpn., vol. 75(9) pp. 2071-2074 (2002).*

Machine translation of JP 06-337496 (14 pages).*

Angeluts et al., "Enhancement of two-photon initiated coloration by energy transfer from dye to photochromic molecules in polymer films", Proc. SPIE, vol. 3732 pp. 232-238 (1999).*

Lee et al., "Two-photon radical photoinitiator system based upon iodinated benzospiropyrans", Chem. Mater., vol. 3, pp. 858-864 (1991).*

Parthenopoulos et al., "Two photon volume information storage in doped polymer systems", J. Appl. Phys., vol. 68(11) pp. 5814-5818 (Dec. 1990).*

Hildebrandt et al., "Quantum dots as resonance energy transfer acceptors for monitoring biological interactions", Proc. SPIE vol. 6191 pp. 61910W-1 to 61910W-9 (2006).*

Elangovan et al., "characterization of one and two-photon excitation fluorescence resonance energy transfer microscopy", Methods, vol. 29 pp. 58-73 (2003).*

"Two- and multiphoton excitation of conjugate-dyes using a continuous wave laser", Hänninen, et al., Medical Physics and Chemistry, University of Turku, P.O. Box 123, 20521, Turku, Finland, Centre for Biotechnology, P.O. Box 123, 20521, Turku, Finland Received Dec. 5, 1995; accepted Feb. 27, 1996. Available online Feb. 11, 1999.

"Direct Nano-Patterning Methods Using Nonlinear Absorption in Photopolymerization Induced by a Femtosecond Laser", Park, et al., Journal of Nonlinear Optical Physics and Materials, vol. 14, Issue 03, pp. 331-340 (2005), Received Feb. 1, 2005.

"Nonlinear fluorescence through intermolecular energy transfer and resolution increase in fluorescence microscopy", Andreas Schönle' et al.,1) High Resolution Optical Microscopy Group, Max-Planck-Institute for Biophysical Chemistry, D-37070 Göttingen, Germany 2) Department of Medical Physics and Chemistry, University of Turku, FIN-20521 Turku, Finland, Received: Sep. 22, 1998; Accepted: Oct. 22, 1998.

"Design, synthesis, and characterization of a novel class of tunable chromophores for second- and third-order NLO applications", Attias, Andre-Jean, et al., Nonlinear Optical Transmission and Multiphoton Processes in Organics II. Edited by Yeates, A. Todd. Proceedings of the SPIE, vol. 5516, pp. 36-46 (Nov. 3, 2004).

"Two-photon laser precision microfabrication and its applications to micro-nano devices and systems", Hong-Bo Sun, et al., Dept. of Appl. Phys., Osaka Univ., Japan, Mar. 2003, vol. 21 Issue: 3, on pp. 624-633.

* cited by examiner

OPTICAL RECORDING MATERIAL, OPTICAL RECORDING METHOD, PHOTOSENSITIVE MATERIAL AND METHOD

TECHNICAL FIELD

The present invention relates to an optical recording material, an optical recording method, a photosensitive material, a photolithography method, a photopolymerization initiator, and a photosensitizer.

BACKGROUND ART

In a microscope, a processing method (photolithography method), and an optical recording method using laser light, spatial resolution is limited by the diffraction limit. That is, laser light can be narrowed down only to a space of an extent of a wavelength range due to wave nature of light. Therefore, the limit of the spatial resolution of observation, processing, and recording by laser light is about half size of the wavelength. For example, in a conventional microscope, once the laser wavelength and numerical aperture of an object lens are determined, the spatial resolution cannot be improved more than a certain value. In this way, observation performance of a microscope, density of optical recording, processing resolution of a semiconductor or the like are limited by the wavelength of laser light. In order to improve the spatial resolution, it is necessary to reduce the laser wavelength.

The spatial resolution of a microscope can be improved by using nonlinear optical effects, such as two-photon absorption and multiphoton absorption. However, in order to excite the fluorescence in a visible region by the multiphoton absorption etc., near-infrared light with a long wavelength must be used. As a result, the spatial resolution of a microscope will be almost the same as a case of usual visible region excitation.

Further, there is a laser microscope disclosed that can improve the spatial resolution without shortening the laser wavelength (patent document 1). This laser microscope uses the nonlinear optical effect generated by saturation of fluorescence to observe the fluorescence. Therefore, a fluorescence microscope with high spatial resolution can be realized without reducing the laser wavelength.

There is a fluorescence microscope disclosed that uses nonlinear effect produced by a donor molecule and an acceptor molecule. As this fluorescence microscope uses the donor molecule and the acceptor molecule, fluorescence occurs from a donor molecule by two-photon absorption or multiphoton absorption. This improves the spatial resolution.

[Patent Document 1] International Patent Publication WO2006/061947

[Non-patent document 1] "Nonlinear fluorescence through intermolecular energy transfer and resolution increase in fluorescence microscopy" Andreas Schonle et al., Ann. Phys. (Leipzig) 8 (1999) 2, 115-133

[Non-patent document 2] "Two-and multiphoton excitation of conjugate-dyes using a continuous wave laser" Pekka E. Hanninen et al., Optics Communications 130 (1996) 29-33

DISCLOSURE OF INVENTION

Technical Problem

However, there is a problem in processing method and optical recording method using laser light, that the spatial resolution is limited by the wavelength.

Thus, in the conventional photolithography method and optical recording method, there has been a problem that the spatial resolution is limited by the wavelength of the laser light.

The present invention is made in view of the abovementioned problem, and aims to provide a nonlinear optical material, an optical recording material, an optical recording method, a photosensitive material, a photolithography method, a photopolymerization initiator, and a photosensitizer that can improve the spatial resolution.

Technical Solution

According to a first exemplary aspect of the present invention, a photosensitive material used for photolithography for forming a pattern by irradiating a photoresist with excitation light includes a donor that is excited by the excitation light, and an acceptor that is excited by energy transfer or charge transfer from the excited donor. This allows to use a nonlinear response of the donor, thereby improving the spatial resolution.

According to a second exemplary aspect of the present invention, as for the photosensitive material, if a photon of the excitation light enters the donor before the excited acceptor shifts to a ground state, excited energy of the donor is used for polymerization reaction, isomerization, or fluorescence reaction. This makes a fluorescence response of the donor be nonlinear, thereby improving the spatial resolution.

According to a third exemplary aspect of the present invention, as for the photosensitive material, a number of the acceptor is more than or equal to a number of the donor. This allows to use high-order nonlinear response, thereby improving the spatial resolution.

According to a fourth exemplary aspect of the present invention, as for the photosensitive material, the number of the donor is more than the number of the acceptor. This allows to use high-order nonlinear response, thereby improving the spatial resolution.

According to a fifth exemplary aspect of the present invention, as for the photosensitive material, the donor and the acceptor are mixed in a solution. This allows to easily close intermolecular distance.

According to a sixth exemplary aspect of the present invention, as for the photosensitive material, the acceptor is embedded in a matrix. This allows to easily close intermolecular distance.

According to a seventh exemplary aspect of the present invention, an optical recording material used for optical recording in which data therein can be rewritten by excitation light irradiation includes a donor that is excited by excitation light, and an acceptor that is excited by energy transfer or charge transfer from the excited donor. This allows to use a nonlinear response of the donor, thereby improving the spatial resolution.

According to a eighth exemplary aspect of the present invention, as for the optical recording material, if a photon of the excitation light enters the donor before the excited acceptor shifts to a ground state, excited energy of the donor is used for polymerization reaction, isomerization, or fluorescence reaction. This makes the fluorescence response of the donor be nonlinear, thereby improving the spatial resolution.

According to a ninth exemplary aspect of the present invention, as for the optical recording material, a number of the acceptor is more than a number of the donor. This allows to use high-order nonlinear response, thereby improving the spatial resolution.

According to a tenth exemplary aspect of the present invention, as for the optical recording material, the number of the donor is more than the number of the acceptor. This allows to use high-order nonlinear response, thereby improving the spatial resolution.

According to a eleventh exemplary aspect of the present invention, as for the optical recording material, the donor and the acceptor are mixed in a solution. This allows to easily close the intermolecular distance.

According to a twelfth exemplary aspect of the present invention, as for the optical recording material, the acceptor is embedded in a matrix. This allows to easily close the intermolecular distance.

According to a thirteenth exemplary aspect of the present invention, an optical recording material used for optical recording in which data therein can be rewritten by excitation light irradiation includes a donor that is formed of a photochromic substance and excited by excitation light, and an acceptor that is excited by energy transfer or charge transfer from the excited donor. This allows to use a nonlinear response of the donor, thereby improving the spatial resolution.

According to a fourteenth exemplary aspect of the present invention, as for the optical recording material, if a photon of the excitation light enters the donor before the excited acceptor shifts to a ground state, the donor isomerizes. This allows to use a nonlinear response of the donor, thereby improving the spatial resolution.

According to a fifteenth exemplary aspect of the present invention, an optical recording method for reading data according to a physical property of a photochromic material that includes a step of irradiating the optical recording material according to the thirteenth or fourteenth aspect with excitation light and exciting the acceptor, and a step of generating a photochromic reaction in the donor while the acceptor molecule is at the excited state and writing data. This allows to use a nonlinear response of the donor, thereby improving the spatial resolution of optical recording.

According to a sixteenth exemplary aspect of the present invention, as for the optical recording method, the photochromic reaction is generated in the donor using excitation light with a different wavelength from the excitation light for exciting the acceptor. This allows to easily improve the spatial resolution.

According to a seventeenth exemplary aspect of the present invention, a photosensitive material used for a photoresist includes a donor that is excited by excitation light, and an acceptor that is excited by energy transfer or charge transfer from the excited donor. This allows to use nonlinear response of the donor, thereby improving the spatial resolution.

According to a eighteenth exemplary aspect of the present invention, as for the photosensitive material, the donor is used for a photosensitive molecule that photochemically reacts, a photopolymerization initiator that starts polymerizing the photosensitive molecule, or a photosensitizer that promotes an initiation reaction of the photopolymerization initiator. This allows to use a nonlinear response of the donor, thereby improving the spatial resolution.

According to a nineteenth exemplary aspect of the present invention, a photolithography method for irradiating a photoresist with excitation light and forming a pattern includes a step of forming the photosensitive material according to the seventeenth or eighteenth aspect over a substrate as a photoresist, a step of irradiating the photosensitive material with excitation light and exciting the acceptor, and a step of exciting the donor while the acceptor is at the excited state and generating a photochemical reaction in a photosensitive molecule in the photosensitive material. This allows to use a nonlinear response of the donor, thereby improving the spatial resolution.

According to a twentieth exemplary aspect of the present invention, a photopolymerization initiator for starting to polymerize a photosensitive molecule included in a photosensitive material includes a donor that is excited by excitation light, and an acceptor that is excited by energy transfer or charge transfer from the excited donor. This allows to use a nonlinear response of the donor, thereby improving the spatial resolution.

According to a twenty-first aspect of the present invention, a photosensitizer for promoting photochemical reacted light of a photosensitive molecule included in a photosensitive material or an initiation reaction of a polymerization initiator includes a donor that is excited by excitation light, and an acceptor that is excited by energy transfer or charge transfer from the excited donor. This allows to use a nonlinear response of the donor, thereby improving the spatial resolution.

Advantageous Effects

According to the present invention, it is possible to provide a nonlinear optical material, an optical recording material, an optical recording method, a photosensitive material, a photolithography method, a photopolymerization initiator, and a photosensitizer that can improve the spatial resolution.

EXPLANATION OF REFERENCE

11 Donor Molecule
12 Acceptor Molecule

Best Mode for Carrying Out the Invention

Exemplary embodiments to which the present invention is applied are described hereinafter. The following explanation describes the exemplary embodiments of the present invention, and the present invention is not limited to the following exemplary embodiments. For the clarity of the explanation, the following explanation is omitted and simplified as appropriate. Further, a person skilled in the art will be able to readily modify, add, and replace each component in the following exemplary embodiments within the scope of the present invention. Note that the components with the same symbols in each drawing indicate similar components, and the explanation is omitted as appropriate.

The nonlinear optical material according to this exemplary embodiment is used for a photosensitive material used in photolithography, and an optical recording material used in optical recording. The spatial resolution can be improved by using the nonlinear optical material. This achieves finer photolithography and higher density of optical recording. That is, a photosensitive material including the nonlinear optical material is used as a resist. This improves the spatial resolution in photolithography. Alternatively, an optical recording material (optical recording medium) including the nonlinear optical material achieves higher density of optical recording.

Figure 1:
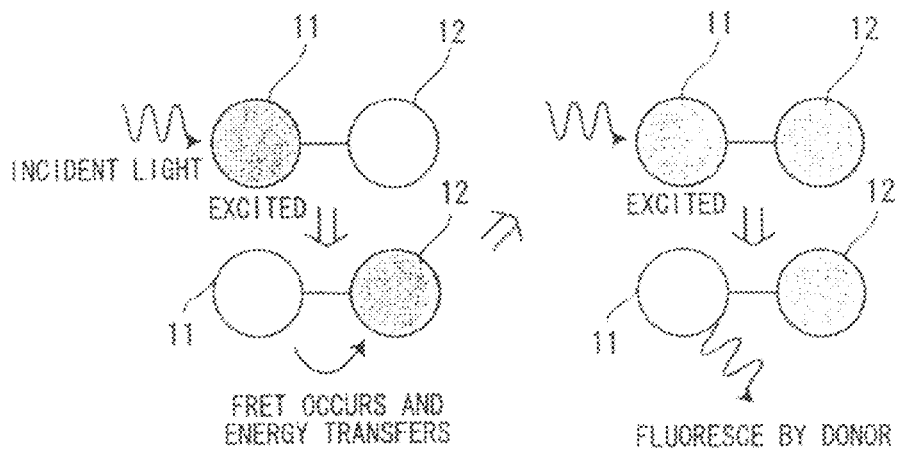
FIG. 1 illustrates an emission process of a nonlinear optical material according to this exemplary embodiment.

First, an emission process is explained as an example, about the principle of a nonlinear response of the nonlinear optical material according to the present invention. FIG. 1 illustrates the emission process of the nonlinear optical material in the case of irradiating with laser light to be excitation light. The nonlinear optical material has donor molecules 11 and acceptor molecules 12. The nonlinear optical effect is generated by energy transfer from the donor molecule 11 to the acceptor molecule 12.

Figure 2:
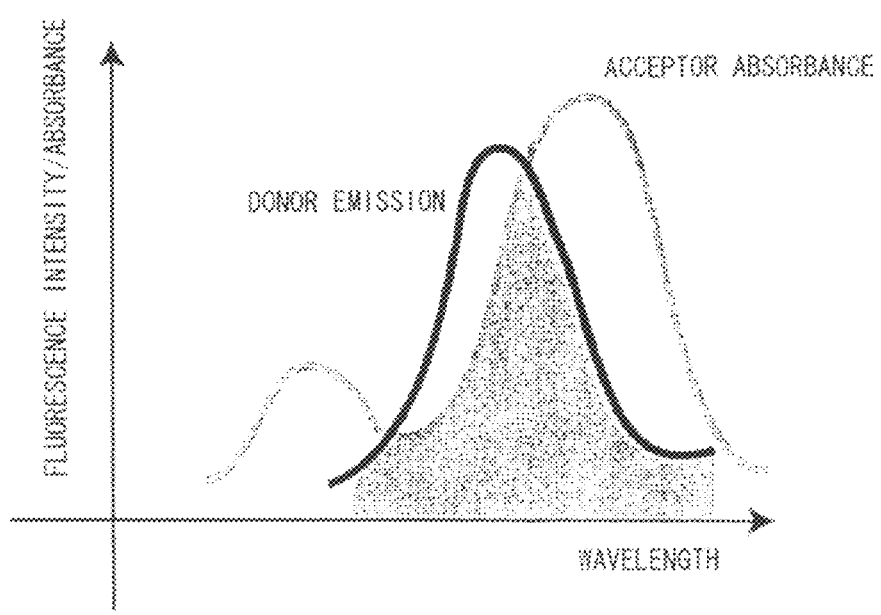
FIG. 2 schematically illustrates an emission spectrum of a donor molecule and an absorption spectrum of an acceptor molecule.

In this exemplary embodiment, the nonlinear optical response is generated using Foerster Resonant Energy Transfer. Foerster Resonant Energy Transfer causes energy transfer between the donor molecules 11 and the acceptor molecules 12. In this exemplary embodiment, the donor molecules 11 shall be a fluorescent substance. FRET, an interaction regarding energy transfer between fluorescent molecules, occurs when a distance between the fluorescent molecules is short (<=10 nm) and an emission wavelength band of the donor molecules and an absorption wavelength band of the acceptor molecules overlap with each other, as illustrated in FIG. 2. Note that FIG. 2 schematically illustrates the emission spectrum of the donor molecule 11, and the absorption spectrum of the acceptor molecule 12. The horizontal axis represents the wavelength, and the vertical axis represents fluorescence intensity or absorbance. Further, a process is explained as an example in which both donor and acceptor emit light, however relaxation from excited state of the donor and acceptor does not always involve emission. In any case, excited energy of the excited donor is used for photoisomerization, photopolymerization, or light emission. Moreover, energy transfer by Dexter Energy Transfer can be used to induce a similar nonlinear response.

FRET is not a result that the acceptor molecule absorbed light emitted from the donor molecule 11, and there is no intermediate photon intervening in FRET. FRET is an interaction of vibrating electric dipoles, and a resonance of the electric dipoles close to a resonant frequency. Therefore, FRET is a phenomenon similar to behavior of conjugated vibration. As described above, in FRET, excited energy between two closely disposed fluorescent molecules will not be electromagnetic wave, but transfers by electronic resonance.

The range in which FRET occurs is determined by the distance between the donor molecule 11 and the acceptor molecule 12, and the overlapped spectra of the donor molecule 11 and the acceptor molecule 12. The distance between the donor molecule 11 and the acceptor molecule 12 at FRET efficiency of 50%, is referred to as a Foerster distance. The typical range of this Foerster distance is between 2 nm and 6 nm. The probability $k_{FRET}(r)$ at which FRET occurs from the donor molecule 11 to the acceptor molecule 12 is represented by the following formula 1 using Foerster distance $R_0$ (see non-patent document 2).

$$k_{FRET}(r) = \frac{1}{\tau_D}\left(\frac{R_0}{r}\right)^6 \quad \text{[Formula 1]}$$

The $\tau_D$ indicates fluorescence lifetime, and r indicates the distance between the donor molecule 11 and the acceptor molecule 12. As illustrated in the formula 1, the probability $k_{FRET}$ is inversely proportional to the sixth power of the intermolecular distance.

When r equals to the Foerster distance $R_0$, the probability $k_{FRET}(r)$ becomes equal to the probability of spontaneous emission. Moreover, when the FRET frequency E is represented by the intermolecular distance r and the Foerster distance $R_0$, it will be as indicated in the following formula 2.

$$E = \frac{R_0^6}{R_0^6 + r^6} \quad \text{[Formula 2]}$$

Figure 3:
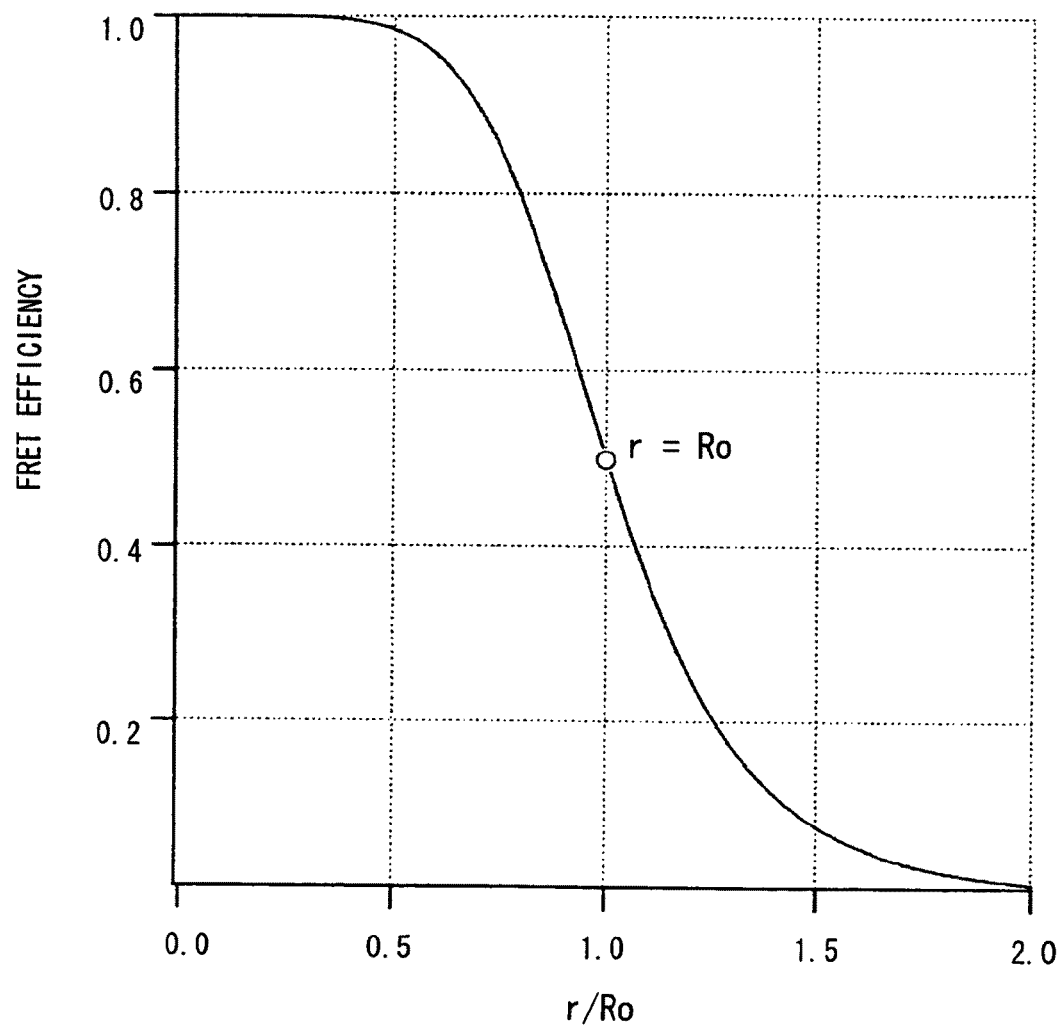
FIG. 3 is a graph illustrating relationship between an intermolecular distance and FRET efficiency.

As illustrated in the formula 2, the FRET efficiency E is strongly influenced by the intermolecular distance r. When plotting the relationship between the FRET efficiency E and the intermolecular distance r, it will be as illustrated in FIG. 3. In FIG. 3, the horizontal axis represents the intermolecular distance ($=r/R_0$) normalized by the Foerster distance $R_0$, and the vertical axis represents the FRET efficiency. For example, when $r=0.1R_0$, the FRET efficiency E=99.999%, and when $r=2R_0$, the FRET efficiency E=1.54%. Therefore, in the nonlinear optical material according to this exemplary embodiment, it is preferable to have a small distance r between the acceptor molecule 12 and the donor molecule 11. The intermolecular distance r is made shorter than the Foerster distance. Further, the intermolecular distance r is preferred to be 10 nm or less.

As with the probability $k_{FRET}$, the FRET efficiency E is inversely proportional to the sixth power of the intermolecular distance r, and largely depends on the distance. The distance in which FRET occurs is in the range between 2 nm and 9 nm, which is almost equal to the distance where an interaction such as protein occurs. For this reason, FRET is a useful tool to observe protein structural change and interaction, and is also referred to as a Spectroscopic Ruler. The Foerster distance $R_0$ used here can be represented by the following formula 3.

$$R_0^6 = \frac{9000(\ln 10)\kappa^2 Q_D}{128\pi^5 N n^4} \int_0^\infty F_D(\lambda)\varepsilon_A(\lambda)\lambda^4 d\lambda \quad \text{[Formula 3]}$$

The Qd represents quantum efficiency in the case that the donor molecule 11 exists alone, N represents Avogadro number, n represents refractive index of a medium interposed, and $F_D(\lambda)$ represents normalized emission spectrum of the donor molecules 11, or emission intensity in a wavelength $\lambda$. The $\epsilon(\lambda)$ is extinction coefficient in the wavelength $\lambda$ of the acceptor molecule 12. The $\kappa^2$ is a value indicating electric dipole of the donor molecule 11 and the acceptor molecule 12, and generally two-thirds is used. This value is a value when the donor molecule 11 and the acceptor molecule 12 are oriented at random. When the orientation is determined, $\kappa^2$ is obtained by the following formula 4.

$$\kappa^2 = (\cos\theta_T - 3\cos\theta_D \cos\theta_A)^2 \quad [\text{Formula 4}]$$

The $\theta_T$ is an angle difference between an emission transition dipole of the donor molecule 11 and an absorption transition dipole of the acceptor molecule 12. The $\theta_D$ and $\theta_A$ are the angle differences of those dipoles and the line connecting between the donor molecule 11 and the acceptor molecule 12.

Here, if a photon of laser light for excitation enters the nonlinear optical material, the donor molecule 11 is excited (upper left of FIG. 1). Then, FRET occurs and energy transfers from the donor molecule 11 to the acceptor molecule 12 (lower left of FIG. 1). When the FRET efficiency is extremely high, almost all of the excited energy of the donor molecule 11 transfers to the acceptor molecule 12 by FRET. Therefore, the donor molecule 11 cannot emit light. When the excitation light intensity increases, the acceptor molecule 12 is excited in saturation, thus the excited energy of the donor molecule 11 cannot transfer to the acceptor molecule 12.

If a photon further enters in this state, the donor molecule 11 is excited (upper right of FIG. 1). Then, since the energy of the donor molecule 11 cannot transfer to the acceptor molecule 12, the donor molecule 11 emits fluorescence (lower right of FIG. 1). That is, without being in the state in which both the donor molecule 11 and the acceptor molecule 12 are excited, fluorescence is not emitted from donor molecule 11. In other words, after the excitation of the acceptor, if a photon does not enter the donor molecule 11 before the acceptor molecule 12 emits fluorescence, the donor molecule 11 does not emit fluorescence.

Not only the photon that excites the donor molecule 11 but the photon that excites the acceptor molecule 12 by FRET are required for emission of the donor molecule. That is, two photons are required for emission of the donor molecule 11. Therefore, fluorescence emission in the donor molecule 11 in a nonlinear optical material requires absorption of two photons. Accordingly, second nonlinearity occurs in the fluorescence intensity of the donor molecule 11.

If n number of the acceptor molecules exist for one donor molecule 11, it is necessary to excite in saturation the n number of the acceptor molecules 12. Hence, (n+1) number of photons are required for emission of the donor molecule. Thus, the nonlinear optical material exhibits the following (n+1) nonlinearity.

Figure 4:
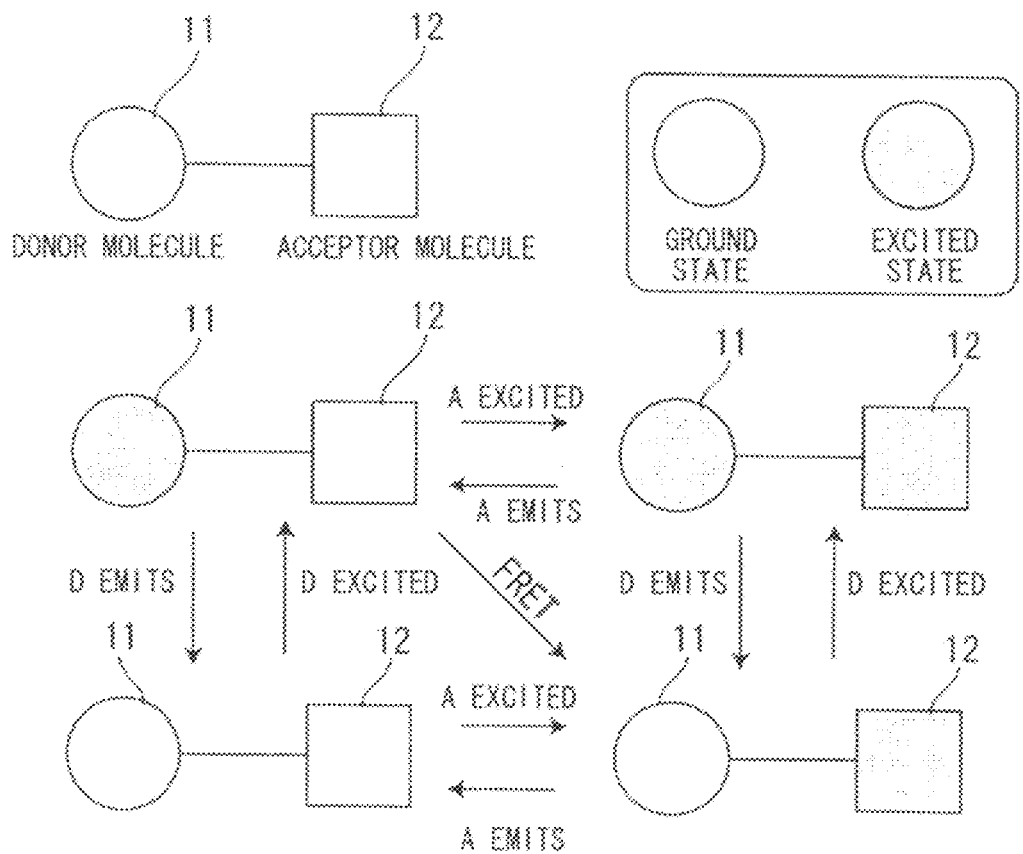
FIG. 4 is a state transition diagram in case a donor molecule and an acceptor molecules make up a pair.

As disclosed in non-patent document 1, the excitation light/fluorescence response of a donor molecule can be obtained by calculation. In this calculation technique, each molecule is expressed using two-level system model. As illustrated in FIG. 4, all the combinations are listed in which each molecule can take a ground state and an excited state, and the transition of the combinations is represented by differential equation. When there is one pair of the donor molecule 11 and the acceptor molecules 12, the differential equation can be represented as in the formula 5.

[Formula 5]

$$\frac{d}{dt}N_{da}(t) = -(k_{Dex} + k_{Aex})N_{da}(t) + k_{Dem}N_{Da}(t) + k_{Aem}N_{dA}(t)$$

$$\frac{d}{dt}N_{Da}(t) = -(k_{Dem} + k_{Aex} + k_{FRET})N_{Da}(t) + k_{Dex}N_{da}(t) + k_{Aem}N_{DA}(t)$$

$$\frac{d}{dt}N_{dA}(t) = -(k_{Aem} + k_{Dex})N_{dA}(t) + k_{FRET}N_{Da}(t) + k_{Aex}N_{da}(t) + k_{Dem}N_{DA}(t)$$

$$\frac{d}{dt}N_{DA}(t) = -(k_{Aem} + k_{Dem})N_{DA}(t) + k_{Dex}N_{dA}(t) + k_{Aex}N_{Da}(t)$$

Here, the $N_{da}$ indicates that the donor molecule and the acceptor molecule are in the ground state. Further, the $N_{Da}$ indicates that the donor molecule is in the excited state, and the acceptor molecule 12 is in the ground state. The $N_{dA}$ indicates that the donor molecule is in the ground state and the acceptor molecule 12 is in the excited state. The $N_{DA}$ indicates that the donor molecule and the acceptor molecule are in the excited states. The $k_{Dex}$ represents excitation probability of the donor molecule, $k_{Dem}$ represents spontaneous emission probability of the donor molecule, $k_{Aex}$ represents the excitation probability of the acceptor molecule, $k_{Aem}$ represents spontaneous emission probability of the acceptor molecule, and $k_{FRET}$ represents FRET transfer probability. The fluorescence intensity I(t) at a certain time t is expressed by the following formula 6.

$$I(t) \propto \frac{k_{Dem}}{k_{Dem} + k_{Aex} + k_{FRET}} N_{Da}(t) + \frac{k_{Dem}}{k_{Dem} + k_{Aem}} N_{Da}(t) \quad [\text{Formula 6}]$$

The representation of the formula 6 in a determinant is illustrated in the formula 7.

[Formula 7]

$$\frac{d}{dt}\begin{pmatrix} N_{da}(t) \\ N_{Da}(t) \\ N_{dA}(t) \\ N_{DA}(t) \end{pmatrix} =$$

$$\begin{pmatrix} -(k_{Dex}+k_{Aex}) & k_{Dem} & k_{Aem} & 0 \\ k_{Dex} & -(k_{Dem}+k_{Aex}+k_{FRET}) & 0 & k_{Aem} \\ k_{Aex} & k_{FRET} & -(k_{Aem}+k_{Dex}) & k_{Dem} \\ 0 & k_{Aex} & k_{Dex} & -(k_{Dem}+k_{Aem}) \end{pmatrix} \begin{pmatrix} N_{da}(t) \\ N_{Da}(t) \\ N_{dA}(t) \\ N_{DA}(t) \end{pmatrix}$$

Figure 5:
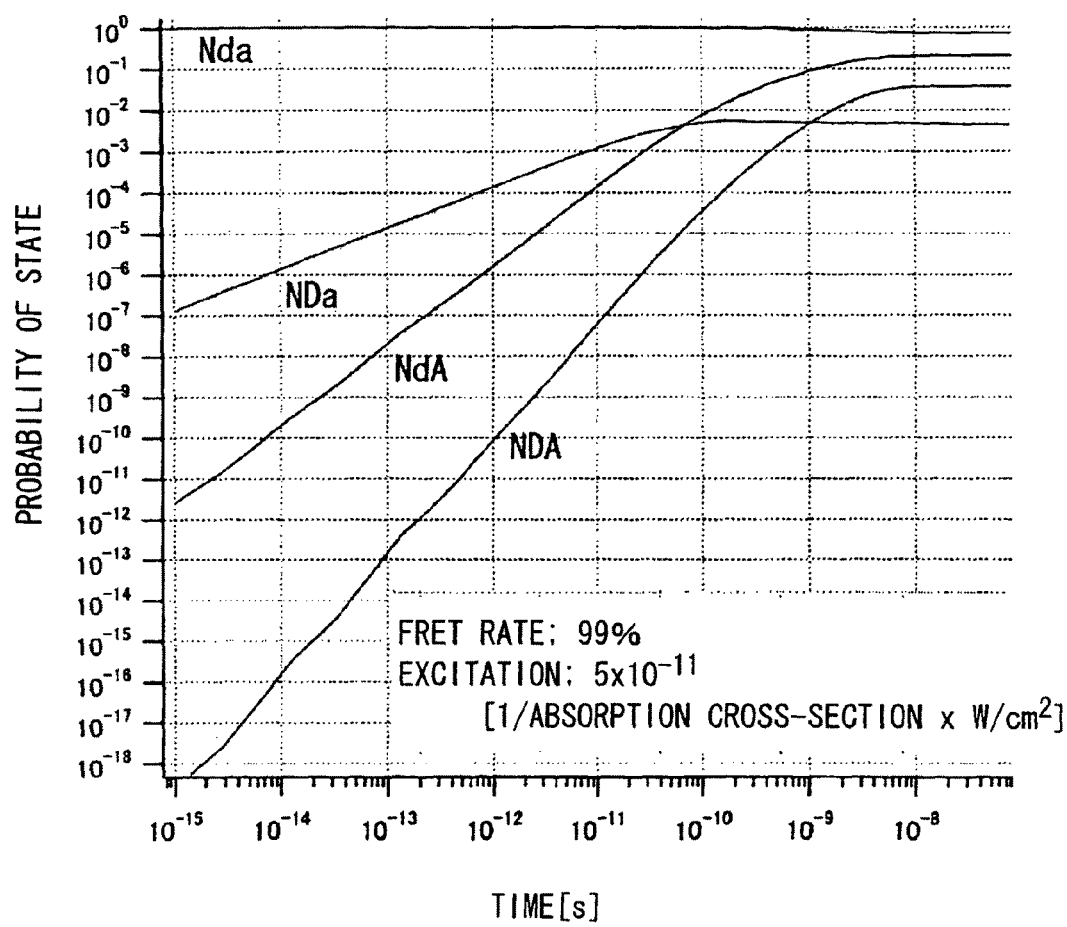
FIG. 5 illustrates the calculation results of solutions of a differential equation indicating state change of FRET.

The result of calculating the solutions of the abovementioned simultaneous differential equation is illustrated in FIG. 5. In FIG. 5, the horizontal axis represents time (logarithm), and the vertical axis represents state probability (logarithm).

From FIG. 5, it can be seen that after the probability of $N_{dA}$ increases, $N_{DA}$, which is the state in which the acceptor molecules 12 are saturated, increases.

Figure 6:
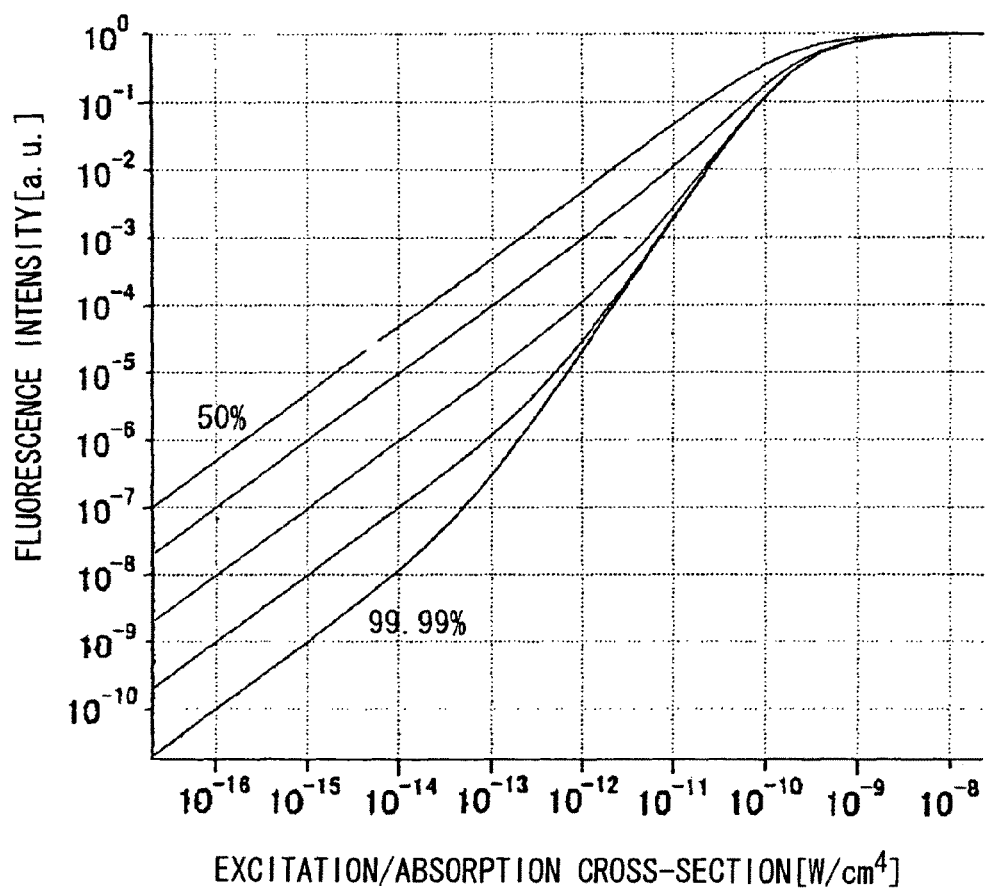
FIG. 6 illustrates the calculation result of a response of the excitation light intensity and fluorescence intensity of donor molecule.

The excitation probability of a molecule is proportional to the excitation light intensity. FIG. 6 illustrates the emission response of the donor molecule when changing the excitation light intensity. As the donor molecule 11, Fluorescein (fluorescence lifetime; 4.0 ns, spontaneous emission efficiency $k_{Dem}=1/4.0$ nsec$=2.5\times10^8$) is used, and as the acceptor molecule 12, Tetramethylrhodamine (fluorescence lifetime; 2.3 nsec and spontaneous emission efficiency $k_{Aem}=1/2.3$ ns$=4.3\times10^8$) is used. FIG. 6 illustrates the calculation result when changing the FRET efficiency to 50%, 90%, 99%, 99.9%, and 99.99%. The graph in FIG. 6 illustrates the calculation results of 50%, 90%, 99%, 99.9%, and 99.99%, from the top.

From this result, it can be seen that the relationship between the excitation light intensity and fluorescence intensity of a donor molecule exhibits second nonlinearity. When the FRET efficiency increases, it can be seen that the excitation light intensity range where nonlinearity occurs becomes wider. For this reason, it is preferable to make the FRET efficiency be 99% or more.

Figure 7:
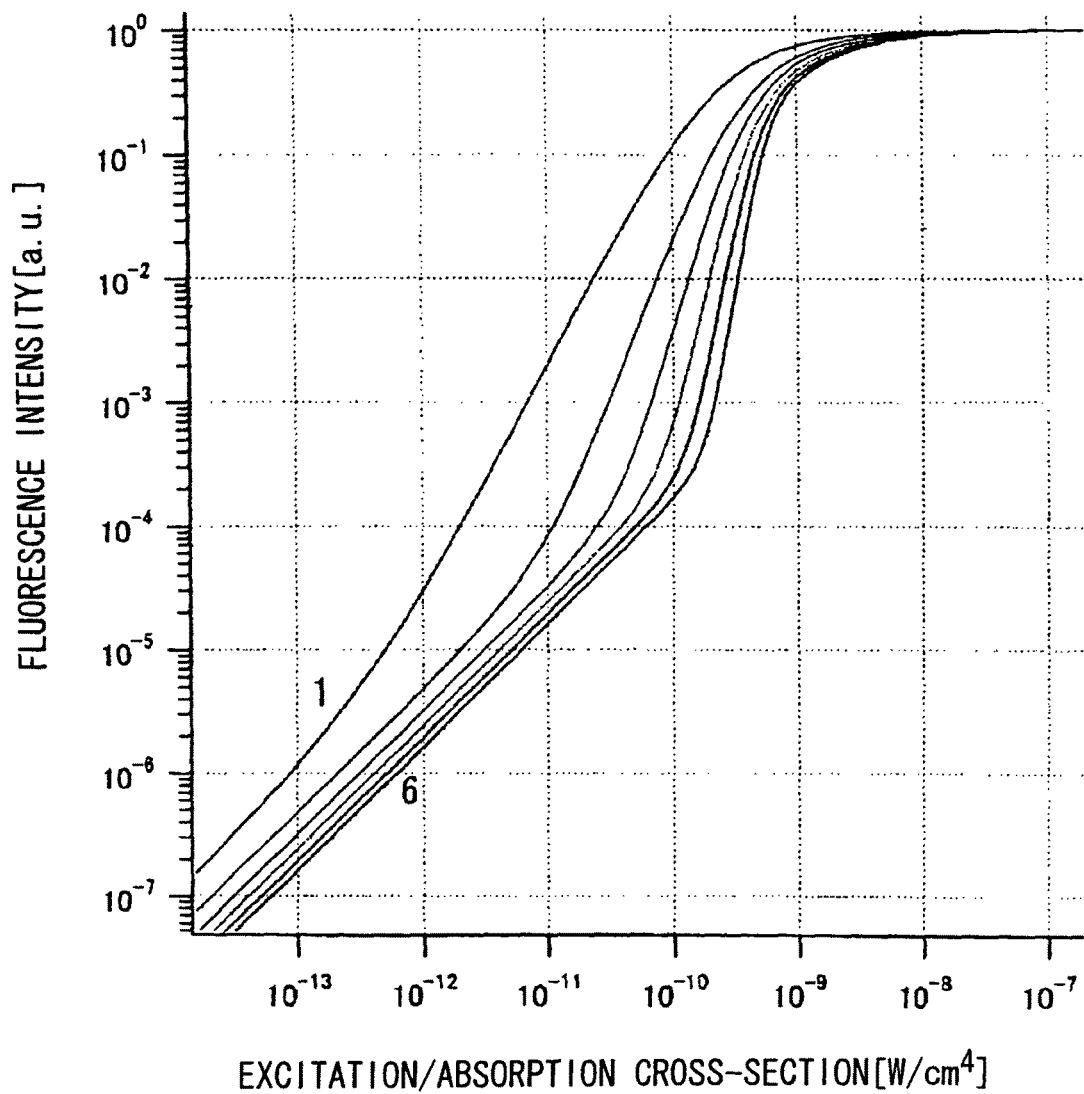
FIG. 7 illustrates the calculation results of a response of the excitation light intensity and fluorescence intensity with different number of acceptor molecules.

As mentioned above, when the number of the acceptor molecules 12 is increased, the emission response exhibits higher order nonlinearity. FIG. 7 illustrates the calculation results when increasing the number of the acceptor molecules 12. FIG. 7 illustrates the relationship between the excitation light intensity and the fluorescence intensity when changing the number of the acceptor molecules 12. The horizontal axis in FIG. 7 represents the excitation light intensity (logarithm), and the vertical axis represents the fluorescence intensity (logarithm). Note that the FRET efficiency shall be 99% and the acceptor molecules are changed from one to six. In the graph of FIG. 7, the calculation results are illustrated when the number of the acceptor is one, two, three, four, five, and six, from the top. It can be seen that when the number of the acceptor molecules becomes n, the gradient of the graph becomes (n+1), and exhibits (n+1) order nonlinearity.

In this exemplary embodiment, a nonlinear material including the donor molecule 11 and the acceptor molecule 12 is used. The energy transfer from the donor molecule 11 to the acceptor module 12 by Foerster Resonant Energy Transfer take place in about 1 to 10 psec, for example. Further, the donor molecule 11 or the acceptor molecule 12 is excited on the order of fsec. The lifetime of the excited state of the donor molecule 11 is about 10 nsec, which is long enough as compared to the time for the energy transfer. Therefore, the donor molecule 11 absorbs multiple photons, and the excited energy of the donor molecule 11 is used for photoisomerization, photopolymerization, and emission. As a result, these optical responses become nonlinear to incident light intensity. That is, the donor molecule 11 is excited multiple times until the acceptor molecule 12 returns to the ground state. This leads to the multiphoton processes in which two photons incident allows for the first time to use the excited energy of the donor molecule 11 for the function included in the donor molecule.

Figure 8:
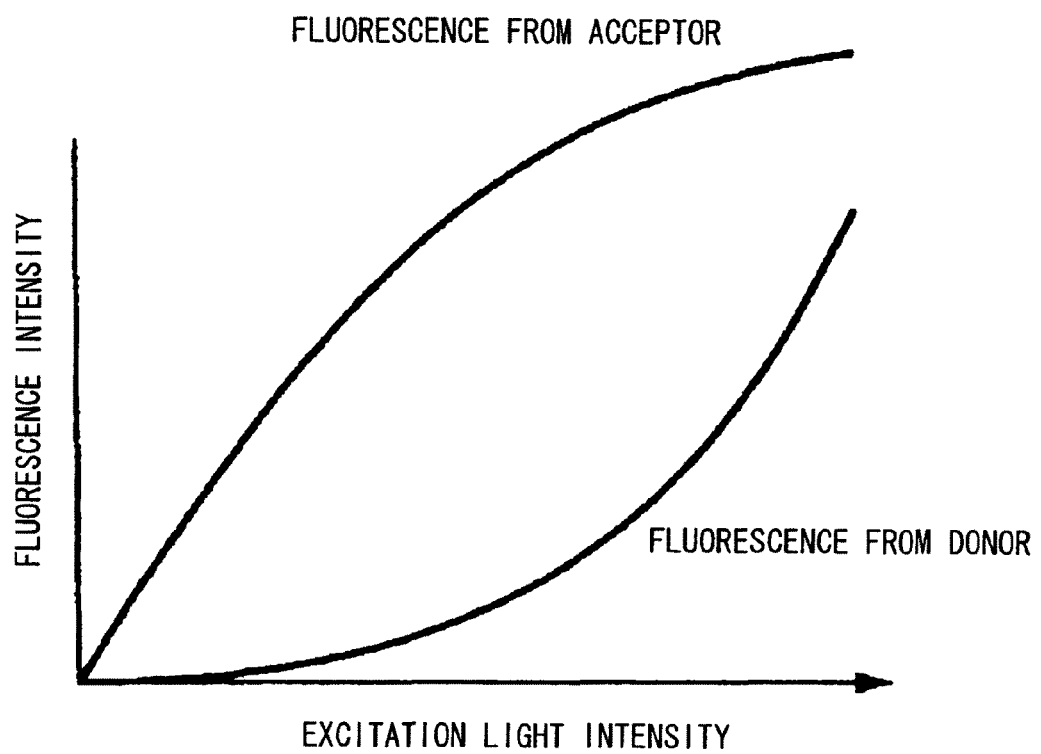
FIG. 8 illustrates the relationship between excitation light intensity and fluorescence luminescence intensity.

As described above, if the energy transfer can be used, the nonlinear response can be induced more strongly. Therefore, the spatial resolution can be induced. Taking the emission process as an example, if the excitation light intensity is small, the donor molecule 11 is excited and the emission of the acceptor molecule 12 is observed. However, if the excitation light intensity becomes large, the donor molecule 11 is excited before the acceptor 12 shifts to the ground state. That is, saturated excitation of the acceptor molecule 12 is used. The relationship between the excitation light intensity and an optical response (fluorescence emission intensity) at this time is illustrated in FIG. 8. In FIG. 8, the horizontal axis represents the excitation light intensity and the vertical axis represents the fluorescence intensity.

For example, as for laser light having cross-section intensity distribution of Gaussian distribution, the excitation light intensity reaches its the maximum at the center of the laser light spot. Then, the farther away from the center of the spot, the smaller the excitation light intensity is. If the abovementioned nonlinear optical material is irradiated with laser light, reaction is intensified only at the center of the spot. By using the nonlinear optical effect, it is possible to obtain effects equivalent to narrowing down the spot of laser light. That is, the spatial resolution can be improved. Therefore, this achieves processing and recording beyond diffraction limit. Further, increasing the number of the acceptor molecules 12 can achieve higher order nonlinear effect. Therefore, the spatial resolution can further be improved. In other words, the more number of the acceptor molecules 12 to be increased, the recording and processing with higher spatial resolution can be possible.

As described so far, the acceptor molecule 12 to be an energy buffer is disposed in close proximity to the donor molecule 11. Then, as the efficiency of Foerster Resonant Energy Transfer increases, the excited energy of the donor molecule 11 is used for photoisomerization, photopolymerization, and emission before the acceptor molecule 12 shifts to the ground state. Thus the nonlinear optical effect can be obtained. It is needless to say that the acceptor molecule 12 may be directly excited. That is, the acceptor molecule 12 is irradiated with laser light to be excitation light so as to excite the acceptor molecule 12. Even in this case, multiphotons are necessary to use the excited energy of the donor molecule 11 for photoisomerization, photopolymerization, and emission. That is, the required number of photons is the number of the acceptor molecules 12 plus one. Further, laser light with different wavelengths may be used for exciting the donor molecule 11 and the acceptor molecule 12. In this case, multiple laser light sources are prepared.

Note that the acceptor molecule 12 is not limited to a fluorescent molecule. For example, the acceptor molecule 12 may be metal or semiconductor not generating fluorescence. For example, metal and a semiconductor quantum dot can be used as an acceptor substance. Specifically, a non-fluorescent substance can be used as the acceptor substance. The acceptor substance to be a buffer of energy may be placed in close proximity to the donor substance. It is also possible to operate one metal particle or semiconductor particle as multiple acceptors. That is, by the metal particle or semiconductor particle operating as the acceptor, three or more photons are absorbed. In the case that the acceptor substance is excited in saturation, the excited energy of the donor molecule 11 is used for photoisomerization, photopolymerization, and emission. By providing the acceptor substance to be the energy buffer, the reaction of the donor exhibits nonlinearity. To be more specific, multiphoton absorption process is generated also for laser light with a short wavelength. Ultraviolet laser and visible light laser can be used for this reaction. Therefore, the spatial resolution can be improved. Further, the acceptor substance may be bonded with the donor substance.

Additionally, the abovementioned nonlinear optical material may be used in a fluid state. For example, aqueous solution in which the donor substance and the acceptor substance are dissolved can be used as the nonlinear optical material. In this case, the intermolecular distance can be shortened by increasing concentration of the donor substance and the acceptor substance. Then, the efficiency of Foerster Resonant Energy Transfer can be improved. As the donor molecule 11, fluorescein is used, and as the acceptor molecule 12, tetramethylrhodamin (TMR) can be used. For example, it is preferable to have 10 μmol/l or more for each of the donor molecule 11 and acceptor molecule 12. This allows to obtain a nonlinear fluorescence response. Note that solvents other than water may be used. In other words, it is possible to use in the state where the acceptor substance and the donor substance are mixed in a solution. Therefore, a fluid nonlinear optical material can be obtained.

In addition, the acceptor molecules 12 may be embedded in a matrix. For example, the acceptor molecule 12 can be dispersed in polymer which is composed of the donor molecule 11 or other molecules. Alternatively, the acceptor molecule 12 and the donor molecule 12 can be included in copolymerization polymer material. The intermolecular distance can be shortened in this way. Therefore, nonlinearity can be improved. As described above, the intermolecular distance can easily be closed by using as a matrix or solution. This further improves the convenience. Incidentally, the acceptor substance and the donor molecule 11 may be bonded. Note that in the above explanation, the acceptor molecule 12 is excited by energy transfer, however the acceptor molecule 12 may be excited by electron transfer. Similar effects can be obtained by such charge transfer. Note that when using the charge transfer, the above nonlinear effect can be obtained by using a molecule formed by bonding two BODIPY by nitrobenzene, for example.

[First Exemplary Embodiment]

An optical recording method using the abovementioned nonlinear optical material is explained. In this exemplary embodiment, the abovementioned nonlinear optical material is used for an optical recording material (optical recording medium). Specifically, optical recording is performed using a photochromic substance. If the photochromic material is excited by excitation light, the physical properties reversibly change. For example, if laser light with a predetermined wavelength enters, a molecule will isomerize. This photochromic material is used for the donor molecule 11.

As the donor molecule 11, diarylethene, azobenzenes, or derivatives thereof can be used. The donor molecule 11 exhibits a photochromic reaction by excitation light irradiation. Therefore, when irradiated with laser light, the donor molecule 11 isomerizes. If the donor molecule 11 isomerizes, the physical properties change. Data is read using the change of the physical properties.

For example, in azobenzene, a cis isomer and a trans isomer reversibly change. Physical properties differ according to whether it is a cis isomer or trans isomer. Therefore, by distinguishing whether it is the cis isomer or trans isomer, data can be read. For example, the cis isomer corresponds to zero, and the trans isomer corresponds to one. It is needless to say that they may be opposite. Then, the data is read by the difference in the physical properties. For example, the cis isomer and the trans isomer are irradiated with laser light with wavelengths having largely different optical absorption rates. Then the reflected light is detected. The distinguish of whether it is the cis isomer or trans isomer is made using reflected light intensity. Then the recorded data can be read.

When rewriting data from zero to one, irradiate with laser light to isomerize from the cis isomer to the trans isomer. In this case, blue light is used, for example. Further, when rewriting data from one to zero, irradiate with laser light to isomerize from the trans isomer to the cis isomer. In this case, for example, ultraviolet radiation is used. The data can be rewritten in this way. Note that in the case of reading data, the laser light intensity is reduced in order not to cause a photochromic reaction. Alternatively, laser light with a different wavelength may be used in order not to cause a photochromic reaction. This prevents from rewriting the data at the time of reading, and thereby allowing to accurately record/read.

Otherwise, diarylethene can be used as the donor molecule 11. Diarylethene causes a photochromic reaction by optical irradiation. That is, an open-ring isomer and a closed-ring isomer reversibly change. Specifically, if cyclic diarylethene is irradiated with laser light with an appropriate wavelength, a ring is closed to form a six-membered cyclic structure. On the contrary, if cyclic diarylethene is irradiated with laser light with a different wavelength, a ring opens to return to the original structure. By appropriately modifying the structure, it is possible to change the wavelength of light that is necessary for color and change in the open and closed ring structure. Then, data is read by optical absorption.

As described above, the photochromic material is used as the donor molecule 11. Further, the acceptor molecule 12 is placed in close proximity to the donor molecule 11. Then, the data can be written by a nonlinear response. By using nonlinearity, the spatial resolution can be improved. This achieves to improve storage density. Note that reading data may be performed by other method than optical absorption. Namely, data may be read according to physical properties of the photochromic material.

The recording method of data using the abovementioned optical recording material is explained. The abovementioned nonlinear optical material is formed on a substrate (disc). For example, a nonlinear optical material is applied to an entire surface of the substrate. Then, the nonlinear optical material is irradiated with laser light to write data. Specifically, laser light is narrowed down by a lens, for example, to form a minute laser spot. Next, the nonlinear optical material is irradiated with the laser light. The laser light is focused to have a focal position on the substrate surface. After that, a photochromic reaction occurs to isomerize molecules in the position where the laser light was irradiated. This leads to change the physical properties in the position, and data of zero or one is written. Alternatively, several laser sources may be prepared to switch the laser light depending on the value of the data. Then, data is written while changing the relative position between the laser light and the substrate. Then, the substrate is irradiated with laser light with a wavelength that does not cause a photochromic reaction to read the data.

That is, the position where the data to read is written is irradiated with laser light. Then, the evaluation of whether the data is zero or one is performed according to the physical properties of the photochromic material in that position. The nonlinear optical effect is used in a similar manner when rewriting data.

If a photon of laser light enters the donor substance before the excited acceptor substance shifts to the ground state, the donor substance will isomerize. The nonlinearity can be obtained in this way. By using the nonlinear response, an optical disc capable of high-density recording can be achieved. In other words, a space to write one bit data can be made small. Note that it is preferable to have an intermolecular distance that has higher the FRET efficiency than isomerization efficiency. The FRET efficiency can be improved in this way.

By placing multiple acceptor molecules 12 for one donor molecule 11, it is possible to achieve higher density. That is, multiple paths from the donor molecule 11 to the acceptor molecule 12 are formed. Therefore, when all the acceptor molecules 12 are excited, which are in the saturated excitation, the donor molecule 11 fluoresces. This achieves to further improve the storage density. Note that if the acceptor molecules 12 are fluorescent substances, the photochromic material is used that does not cause a photochromic reaction by fluorescence from the acceptor molecule. In other words, a wavelength band in which a photochromic reaction occurs is kept from overlapping with a wavelength band of the fluorescence from a acceptor molecule. A nonfluorescent molecule may be used as a acceptor substance. This achieves to expand the range of choices for the materials such as the acceptor substance.

[Second Exemplary Embodiment]

A photolithography method according to this exemplary embodiment uses a photosensitive material including the abovementioned nonlinear optical material. That is, the photosensitive material including the nonlinear optical material is used as a photoresist to pattern.

The photoresist using a cross-linking reaction includes oligomer and monomer, for example. If the photoresist is irradiated with laser light, polymer is formed by photo-cross-linking. Further, a polymerization initiator or the like may be included in the photoresist. If the polymerization initiator is irradiated with laser light, radicals come out from the polymerization initiator. That is, free radicals are generated. A monomer bonds with the radical. The bonded monomer bonds with other monomers. In this way, bonding proceeds in chain reaction and the monomers change into polymers. The radical polymerization reaction proceeds and polymer is formed. Hence, in the part irradiated with laser light, the photoresist is hardened, for example. Further, a sensitizer is sometimes used for promoting the reaction of the resist material. The sensitizer promotes initiation reaction of the polymerization initiator or the optical response of the photosensitive material.

According to this exemplary embodiment, the nonlinear optical material is used for a photosensitive molecule, the photopolymerization initiator (photoinitiator), or the photosensitizer. If the nonlinear optical material is used for the photosensitive molecule, nonlinearity occurs in the photoreaction. Further, if the nonlinear optical material is used for the photopolymerization initiator, nonlinearity occurs in the initiation reaction which starts polymerization of the photosensitive molecule. If the nonlinear optical material is used for the photosensitizer, nonlinearity occurs in the initiation reaction of the polymerization initiator, or the photoreaction of the photosensitive material. As a result, it is possible to realize the photolithography with high spatial resolution. For example, if an irradiation with laser light to be excitation light is performed, a photochemical reaction occurs in the photosensitive molecule. The photochemical reaction occurs at high resolution by nonlinearity. Therefore, a resist pattern can be formed with high spatial resolution. Then, a thin film is etched using such resist pattern as a mask. This achieves pattern formation with high spatial resolution.

For example, if this is used in the photolithography in a semiconductor process, it is possible to realize miniaturization of a wiring pattern. Accordingly, integration of the semiconductor can be improved. For example, the nonlinear optical material is dissolved in a solvent, and applied on a substrate such as a semiconductor wafer. Thus, the photoresist is formed to the entire surface of the substrate. Next, the nonlinear optical material is irradiated with laser light to harden the photoresist. That is, laser light is narrowed down by a lens, for example, to form a minute laser spot. Then, the nonlinear optical material is irradiated with the laser light. The laser light is focused to have a focal position on the substrate surface. If a resist pattern is developed using a developing solution, a resist pattern is formed. Further, a conductive material, such as metal, semiconductor material, and insulating material, is etched using this resist pattern. A minute pattern can be formed in this way. It is needless to say that the nonlinear optical material may be used for photolithography other than semiconductor process.

A substance to be an acceptor is placed or bonded in or with a photosensitive molecule in the resist material. Then the photoreaction caused by the photosensitive molecule can be nonlinear to irradiation intensity. Therefore, it is possible to realize high spatial resolution lithography technology. For example, the nonlinear optical material can be used for the resist material which performs photo-cross-linking to reactive oligomer or monomer. In this case, an acceptor substance may be placed or bonded in or with a photodimerized type photosensitive molecule or a photosensitive molecule having diazo group and azido group as photosensitive group. In this way, a cross-linking reaction generated by a photosensitive molecule can be nonlinear to the irradiation intensity.

Further, the nonlinear optical material can be used for the resist material using photomodification such as azide novolac, o-naphthoquinone diazide novolac. In this case, an acceptor substance is added to the photosensitive molecule (an azide compound, o-naphthoquinone diazide, etc.) in a resist material. Alternatively, the nonlinear optical material can be used to photopolymerization initiators for radical polymerization and cationic polymerization (such as aryl diazonium salts, diaryl iodonium salts, triaryl sulfonium salts, triaryl selenonium salts, dialkylphenacylsulfonium salts, dialkyl-4-hydroxyphenyl sulfonium salts, sulfonic acid ester, iron-arene compound, and silanol-aluminum complex). In this case, an acceptor substance is added to photopolymerization initiators, such as radical polymerization and cationic polymerization. In this way, nonlinear photomodification and photopolymerization is shown to the irradiation intensity, and high spatial resolution lithography technology is realized. Further, an acceptor substance is placed or bonded in or with photodegradable polymer such as polymethyl methacrylate etc. In this way, a photolysis reaction can be made nonlinear to irradiation intensity, and thereby achieving high processing resolution.

Moreover, it is effective to add the acceptor substance to the sensitizer that promotes exposure reaction of the resist material. By adding an acceptor molecule, energy transfer from a substance to be the sensitizer (for example an acridine orange, benzoflavin, or the like to diaryliodonium salt) to a polymerization initiator or a reactive oligomer and monomer becomes nonlinear to the irradiation intensity. This achieves high spatial resolution lithography technology.

If a photon of laser light enters the donor substance before the excited acceptor substance shifts to the ground state, the donor material is exited. The nonlinearity can be obtained in this way. By using the nonlinear response, processing with high resolution can be realized. That is, a finer wiring pattern or the like can be formed. Note that it is preferable to have an intermolecular distance that has higher the FRET efficiency than photomodification efficiency. The FRET efficiency can be improved in this way.

Moreover, by placing more number of the acceptor molecules 12 than the donor molecules 11, higher density can be achieved. For example, multiple acceptor molecules 12 can be placed for one donor molecule 11, or three acceptor molecules 12 can be placed for two donor molecules 11. As described above, by placing more number of the acceptor molecules 11 than the donor molecules 11 for the donor molecule 11, multiple paths from the donor molecule 11 to the acceptor molecule 12 are formed. Therefore, when all the acceptor molecules 12 are excited, which is in the saturated excited state, the donor molecule 11 fluoresces. Accordingly, the spatial resolution can further be improved. Hence, a finer pattern can be formed. If the acceptor molecule 12 is a fluorescent substance, an acceptor material is chosen to cause neither a photoreaction nor an initiation reaction by fluorescence from the acceptor molecule 12. Specifically, a wavelength band in which the photoreaction and the initiation reaction occurs is kept from overlapping with a wavelength band of the fluorescence from the acceptor molecule 12. Moreover, a nonfluorescent molecule may be used as the acceptor substance. This achieves to expand the range of choices for the materials such as the acceptor substance.

Further, high nonlinear effect can be achieved by placing more number of the donor molecules 11 than the acceptor molecules 12 for the acceptor molecule 12. For example, multiple donor molecules 11 can be placed for one acceptor molecule 12, or three donor molecules 11 can be placed for two acceptor molecules 12. If n number of the donor molecules 11 are placed for one acceptor molecule 12, the number of energy levels in the state at least one donor molecule 11 is excited is n. Then, the excitation probability $k_{dex}$, which is the probability of excited donor molecules 11 to the total number, increases, thereby improving the FRET efficiency than the state in which one donor molecule 11 is placed for one acceptor molecule 12. Furthermore, as described above, as lifetime of the excited state of the donor molecule is about 10 nsec, if femtolaser with a shorter pulse width than the lifetime of the excited state of the donor molecule 11 is used as a light source, photons in the laser light can enter the donor molecule. Therefore, it is possible to effectively prevent the donor molecule 11 from shifting from the excited state to the ground state, and to efficiently excite the donor molecule 11. Thus, the FRET efficiency can be improved.

Note that it is not necessary to place different numbers of the donor molecules 11 and the acceptor molecules 12, and the above nonlinear effect can be obtained by placing the same number of the donor molecules 11 and the acceptor molecules 12.

[Third Exemplary Embodiment]

Figure 9:
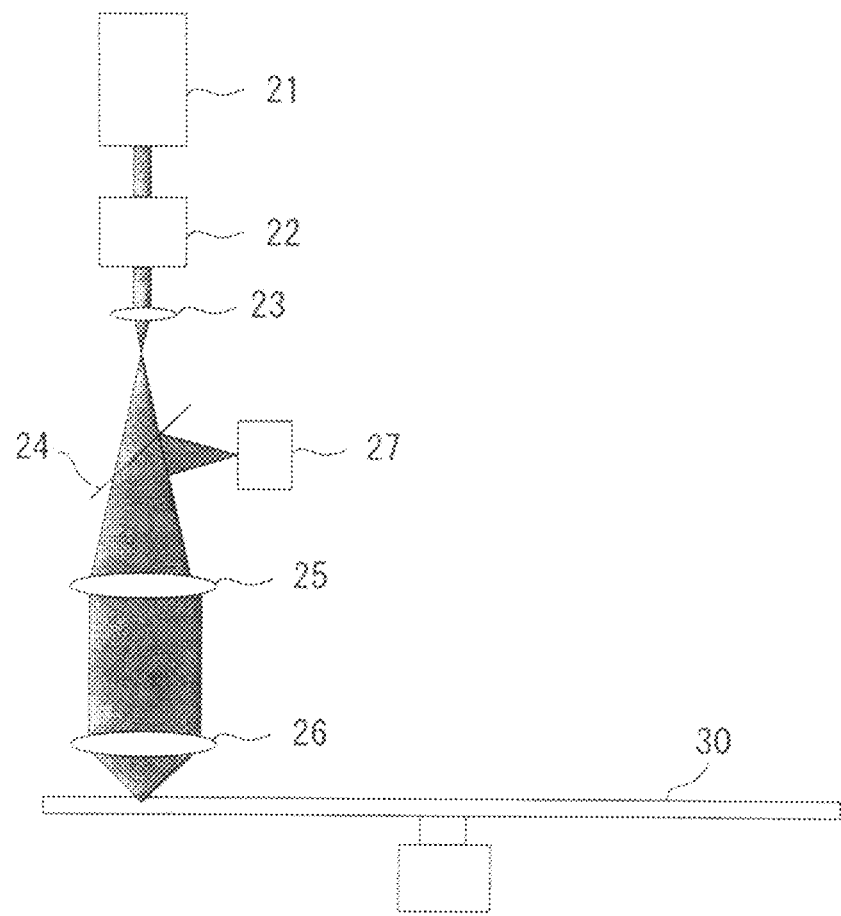
FIG. 9 illustrates the entire configuration example of a super-resolution optical recording and reproducing apparatus.

A super-resolution optical recording and reproduction apparatus according to this exemplary embodiment is an apparatus to record, rewrite, and reproduce data using the optical recording material (optical recording medium) according to the first exemplary embodiment. FIG. 9 illustrates the entire configuration example of the super-resolution optical recording and reproduction apparatus according to this exemplary embodiment. In FIG. 9, 21 is a laser light source, 22 is an optical intensity modulator for controlling optical intensity of laser light from the laser light source 21, 23 and 25 are lenses, 24 is a dichroic mirror, 26 is a lens for recording/reading that focuses light on an optical recording material, 27 is a light for reading detector, and 30 is an optical recording material including the donor molecule 11 formed of a photochromic material.

As for the laser light irradiated from laser light source 21, the light intensity is modulated by the optical intensity modulator 22. The modulated light is deflected at the lens 23, expanded, and enters the lens 25 through the dichroic mirror 24. The incident light is converted into parallel light by the lens 25, and enters the lens for recording/reading 26. The light incident on the lens for recording/reading 26 is focused on the optical recording material 30. The optical recording material 30 includes the donor molecules 11 formed of a photochromic material. The donor molecule 11 exhibits the photochromic reaction and reversibly changes into an cis isomer or a trans isomer by excitation light irradiation. At the time of recording data, by changing the donor molecule 11 at a desired position into a cis isomer or trans isomer by irradiating with laser light, bit data is written.

At the time of reading data, the optical recording material 30 is irradiated with laser light from the laser light source 21 in a similar way at the time of recording. Note that as for the laser light source 21, it is necessary to have different wavelengths for laser light to record data and laser light to read data, thereby actually requiring two laser light beams. However they are omitted in the drawings. The donor molecule 11 which is formed of a photochromic material largely differs in optical absorption rate at a predetermined wavelength between a cis isomer and trans isomer. Therefore, this wavelength is selected to irradiate the optical recording material 30. Light for reading is reflected from the optical recording material 30 which is irradiated with illumination light. This light for reading is converted into parallel light by the lens 26. The parallel light is focused by the lens 25 and enters the dichroic mirror 24. The light for reading reflected by the dichroic mirror 24 is received by the light detector 27. At the time of reading data, by receiving light by the light detector 27, the donor molecule 11 is evaluated whether it is a cis isomer or a trans isomer according to received reflection intensity. Then the data stored to the optical recording material 20 is read.

Note that a data reading apparatus is not limited to the one illustrated in FIG. 9, but a reading apparatus using various super-resolution technology can be used. For example, Japanese Unexamined Patent Application Publication No. 2007-264664 discloses a reading apparatus using the nonlinearity suggested by the present inventors. By using the reading apparatus using such existing super-resolution technology, it is possible to realize high-resolution data reading.

Figure 10:
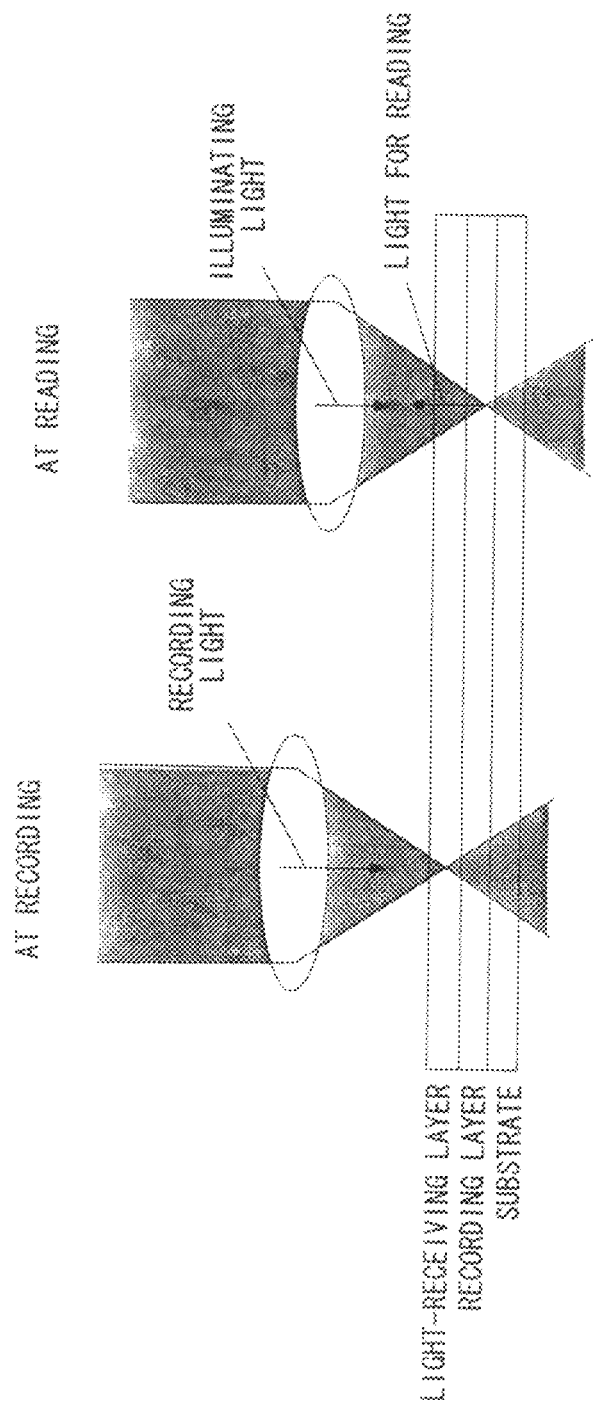
FIG. 10 illustrates a recording and reading method when adopting a super-resolution recording method.
Figure 11:
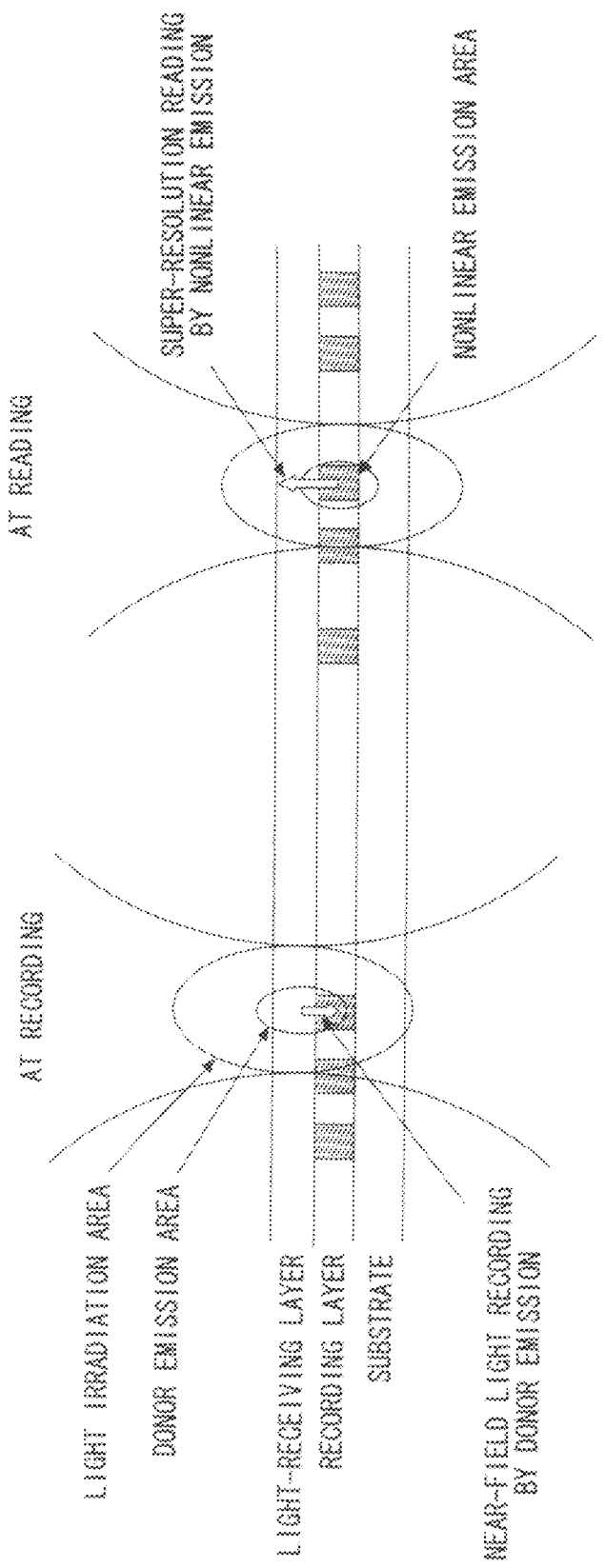
FIG. 11 illustrates a super-resolution recording method when using a light emitter to a donor.

FIG. 10 illustrates a storing and reading method when adopting the super-resolution recording method, and FIG. 11 illustrates a super-resolution storing method when using a light emitter for a donor. As for the optical recording disc, a recording layer and an light-receiving layer are formed on the substrate. Although the recording layer and the light-receiving layer are formed as different layers in FIGS. 10 and 11, a recording layer and an light-receiving layer may be one layer. The nonlinear material having the donor molecule 11 and the acceptor molecule 12 is included in the recording layer and the light-receiving layer. As illustrated in FIG. 10, at the time of recording, by an irradiation with recording light, super-resolving recording is performed by nonlinear emission from molecules of the light-receiving layer. At the time of reading, super-resolving reading is performed by using nonlinear emission from molecules of the recording layer.

This is explained further in detail with reference to FIG. 11. As with FIG. 10, the recording layer is formed on a substrate and a light-receiving layer is formed on the recording layer. At the time of recording data, laser light enters from the light-receiving layer side. The incident laser light is focused by the light-receiving layer with lens 26. At the time of recording data, data is recorded on the recording layer by near-field light generated by emission of the donor molecule 11 included in the light-receiving layer of the optical recording material 30. Since an emission area of the donor molecule 11 for writing data is smaller than an irradiation area of laser light, a space to write one bit data can be smaller than the irradiation area of the laser light. This achieves to write data in high density.

Further, at the time of reading data, data can be read with high resolution by the super-resolution reading apparatus that uses nonlinearity as described above. Specifically, since the donor molecule 11 included in the recording layer of the optical recording material 30 emits light in a nonlinear way, data can be read with smaller resolution than the irradiation area of the laser light.

As mentioned above, if the nonlinear material is used for an optical recording disc, it is easy to realize multiple layers. Further, by using the nonlinear material for the optical recording disc, multilayer recording and reading can be possible without using ultra-short pulse laser.

[Fourth Exemplary Embodiment]

Figure 12:
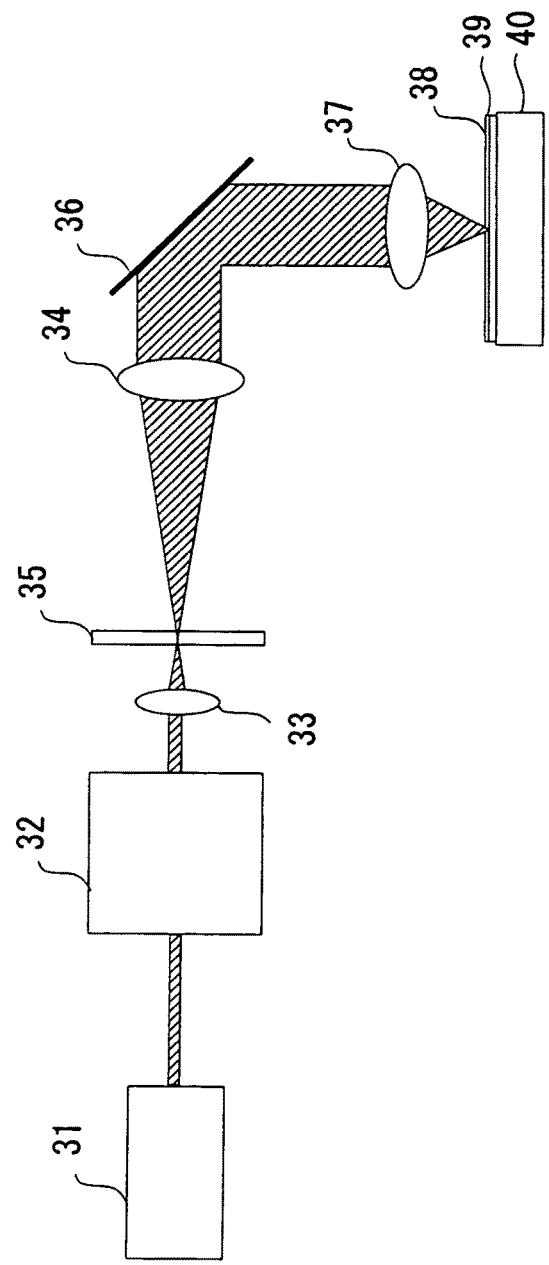
FIG. 12 illustrates the entire configuration example of a super-resolution processing apparatus according to this exemplary embodiment.

A super-resolution optical processing apparatus according to the present invention is an apparatus for performing the photolithography method according to the second exemplary embodiment. FIG. 12 illustrates the entire configuration example of the super-resolution optical processing apparatus according to this exemplary embodiment. In FIG. 12, 31 is a laser light source, 32 is laser scanning optic system (galvanometer mirror or the like), 33 and 34 are lenses, 35 is a photomask, 36 is a mirror, 37 is an objective lens, 38 is an photosensitive material in which a substance to be an acceptor is placed in a photosensitive molecule to be a donor, 39 is a workpiece substrate (substrate etc.), and 40 is a stage.

The laser light irradiated from the laser light source 31 is scanned by the laser scanning optical system 32, and is focused on the photomask 35 via the lens 33. The light which passed through the photomask 35 is converted into parallel light by the lens 34, deflected by the mirror 36, and enters the object lens 37. This light is focused by the objective lens 37 onto the workpiece substance 39 on the stage 40. The photosensitive material 38 on the workpiece substance 39 is irradiated with laser light according to a mask pattern of the photomask 35. Since the photosensitive material 38 includes the photosensitive molecule having the substance to be the acceptor placed therein as described above, in the part irradiated with laser light with the photomask 35 interposed therebetween, the photochemical reaction of the photosensitive molecule becomes nonlinear. Then, the cross-linking by the photosensitive molecule to be a donor and a polymerization reaction become nonlinear to the irradiation intensity of the laser light.

Figure 13:
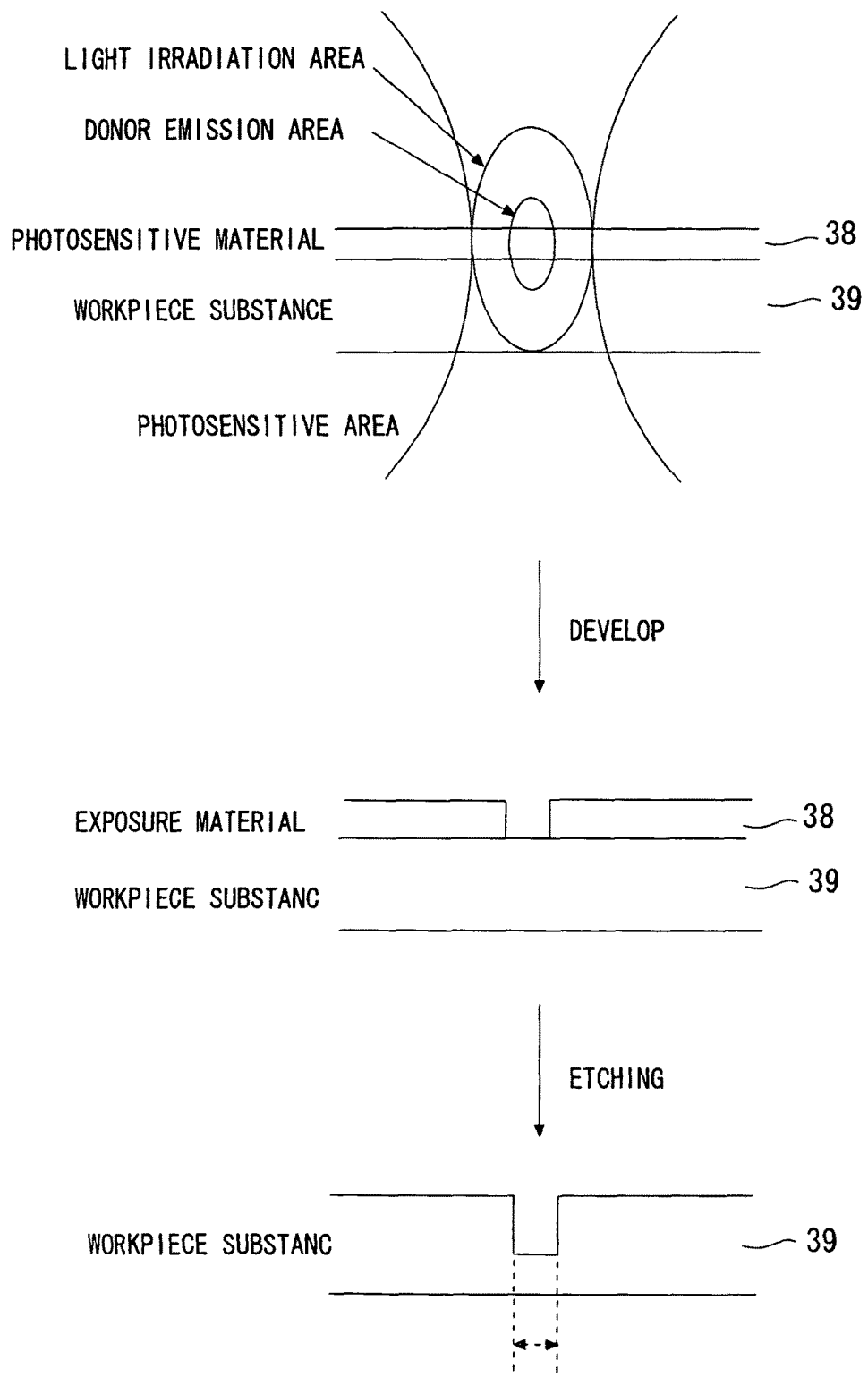
FIG. 13 illustrates an effect when processing a workpiece material using the super-resolution processing apparatus according to this exemplary embodiment.

FIG. 13 illustrates effects when processing a workpiece material using the super-resolution optical processing apparatus according to this exemplary embodiment. The response area of the photosensitive molecule to be a donor is narrower than the irradiation area of the laser light. Therefore, an exposure area of the exposed material 30 in the area irradiated with laser light can be made smaller. The photosensitive material 38 thus exposed is developed, and the exposed material 38 on the workpiece substance 39 is removed. Then, by performing an etching using the remaining photosensitive material 38 as a mask, the workpiece substance 39 can be processed in a desired shape. Since a photochemical reaction is generated in the emission area of the donor, which is smaller than the irradiation area of the laser light, it can be made smaller the irradiation area of laser light also for processing the workpiece substance. Thus, the processing resolution can be improved.

[Other Exemplary Embodiment]

The abovementioned nonlinear optical material can also be used for three-dimensional recording and three-dimensional processing. That is, since the nonlinear effect is used, the spatial resolution improves also in the vertical direction (optical axis direction). Therefore, high resolution can be realized also in the three-dimensional recording and processing. In the optical axis direction, a nonlinear response is generated near a focal position of laser light. Therefore, the spatial resolution of the three-dimensional recording and three-dimensional processing can be improved. Further, the abovementioned nonlinear optical material can be used for a fluorescence microscope. Then a sample can be observed with high resolution.

A donor and acceptor may be bonded within the same molecule or the substance. That is, it may be the structure including an acceptor unit and a donor unit in one molecule or a substance. For example, there may be a part provided that functions as an acceptor and a donor in one substance. An acceptor and a donor may be bonded to form one molecule. Further, the excitation light is not limited to laser light. It is needless to say that the donor may not be a fluorescent substrate.

This application claims priority rights based on the Japanese Patent Application No. 2008-018665 filed in Japan on Jan. 30, 2008, the entire disclosure of which is hereby incorporated by reference herein.

INDUSTRIAL APPLICABILITY

The present invention can be used for a nonlinear optical material, an optical recording material, an optical recording method, a photosensitive material, a photolithography method, a photopolymerization initiator, and a photosensitizer.

The invention claimed is:

1. An optical recording material used for optical recording in which data therein is rewritten by irradiating with an excitation light, the optical recording material comprising:
 a donor molecule that is excited by a first photon of the excitation light to an excited state; and
 an acceptor molecule that is excited to an excited state by an energy transfer or a charge transfer from the excited donor molecule,
 wherein before the acceptor molecule shifts from the excited state to a ground state, a nonlinear polymerization reaction, an isomerization reaction, or a fluorescence reaction is generated by a net nonlinear optical response in which the donor molecule absorbs a second photon of the excitation light, and
 wherein the net nonlinear optical response is generated in an area smaller than an irradiation area of the excitation light in the optical recording material.

2. The optical recording material according to claim 1, wherein the acceptor molecule comprises at least one of a fluorescent molecule, a metal quantum dot, and a semiconductor quantum dot.

3. The optical recording material according to claim 1, wherein a number of the acceptor molecule is more than a number of the donor molecule.

4. The optical recording material according to claim 1, wherein a number of the donor molecule is more than a number of the acceptor molecule.

5. The optical recording material according to claim 1, wherein the donor molecule comprises a photochromic material and the isomerization reaction is generated by the nonlinear optical response.

6. An optical recording method, comprising:
 irradiating the optical recording material according to claim 5 with the excitation light and exciting the acceptor molecule; and
 generating a photochromic reaction in the donor molecule while the acceptor molecule is at an excited state and writing data.

7. The optical recording method according to claim 6, wherein the photochromic reaction is generated in the donor molecule using an excitation light with a different wavelength from the excitation light for said exciting the acceptor molecule.

8. The optical recording material according to claim 1, wherein the donor molecule is excited by being irradiated with a laser light as the excitation light.

9. The optical recording material according to claim 1, wherein the donor molecule is excited multiple times until the acceptor molecule shifts to the ground state.

10. A photosensitive material used for a photoresist, the photosensitive material comprising:
   a donor molecule that is excited by a first photon of an excitation light to an excited state; and
   an acceptor molecule that is excited to an excited state by an energy transfer or a charge transfer from the excited donor molecule,
   wherein before the acceptor molecule shifts from the excited state to a ground state, a polymerization reaction, an isomerization reaction, or a fluorescence reaction is generated by a net nonlinear optical response in which the donor molecule absorbs a second photon of the excitation light, and
   wherein the net nonlinear optical response is generated in an area smaller than an irradiation area of the excitation light in the optical recording material.

11. The photosensitive material according to claim 10, wherein the donor molecule comprises a photosensitive molecule that photochemically reacts, a photopolymerization initiator that starts polymerization, or a photosensitizer that promotes an initiation reaction of the photopolymerization initiator.

12. A photolithography method for irradiating a photoresist with an excitation light and forming a pattern, the photolithography method comprising:
   forming the photosensitive material according to claim 10 over a substrate as a photoresist;
   irradiating the photosensitive material with the excitation light causing absorption of a first photon by the donor molecule, which then excites the acceptor molecule; and
   exciting the donor molecule with a second photon of the excitation light, while the acceptor molecule is at an excited state and generating a photochemical reaction in a photosensitive molecule in the photosensitive material.

13. The photosensitive material according to claim 10, wherein the donor molecule comprises a photochromic material.

14. The photosensitive material according to claim 13, wherein the isomerization reaction is generated by the nonlinear optical response.

15. The photosensitive material according to claim 10, wherein the donor molecule is excited by being irradiated with a laser light as the excitation light.

16. The photosensitive material according to claim 10, wherein the donor molecule is excited multiple times until the acceptor molecule shifts to the ground state.

17. The photosensitive material according to claim 10, wherein a radical generation is induced by the nonlinear optical response.

* * * * *